United States Patent
Immel

[11] Patent Number: 5,931,979
[45] Date of Patent: Aug. 3, 1999

[54] FILTER VENTILATOR BUILT IN A HF-TIGHT MANNER INTO A SLOT OF A MOUNTING PLATE

[75] Inventor: Manfred Immel, Mittenaar-Bicken, Germany

[73] Assignee: Rittal-Werk Rudolf Loh GmbH & Co. KG, Herborn, Germany

[21] Appl. No.: 08/952,842
[22] PCT Filed: Jun. 27, 1996
[86] PCT No.: PCT/EP96/02807
§ 371 Date: Nov. 24, 1997
§ 102(e) Date: Nov. 24, 1997
[87] PCT Pub. No.: WO97/04630
PCT Pub. Date: Feb. 6, 1997

[30] Foreign Application Priority Data
Jul. 15, 1995 [DE] Germany ............ 195 25 850

[51] Int. Cl.⁶ .................................................. B01D 35/02
[52] U.S. Cl. .......................... 55/385.6; 55/471; 55/486; 55/502; 454/184
[58] Field of Search .................... 55/385.6, 385.7, 55/467, 471, 360, 473, 501, 502, 495, 486, 509, DIG. 31; 361/694, 695; 454/184

[56] References Cited

U.S. PATENT DOCUMENTS

| | | | |
|---|---|---|---|
| 4,327,398 | 4/1982 | Christison | 55/385.6 X |
| 4,334,899 | 6/1982 | McConnell | 55/509 X |
| 4,744,005 | 5/1988 | Milani | 55/385.6 X |
| 4,781,526 | 11/1988 | Mead | 55/501 X |
| 4,926,291 | 5/1990 | Sarraf | 55/385.6 X |
| 5,007,946 | 4/1991 | Babini | 55/501 |
| 5,101,321 | 3/1992 | Remise et al. | 454/184 X |
| 5,431,974 | 7/1995 | Pierce | 55/385.6 X |

FOREIGN PATENT DOCUMENTS

| | | |
|---|---|---|
| 162960 | 12/1985 | European Pat. Off. . |
| 397616 | 11/1990 | European Pat. Off. . |
| 425326 | 5/1991 | European Pat. Off. . |
| 64962 | 5/1995 | European Pat. Off. . |
| 8703954 | 6/1987 | Germany . |
| 9306032 | 1/1994 | Germany . |
| 4312664 | 7/1994 | Germany . |

OTHER PUBLICATIONS

Carl Hanser Verlag, Elektro–chemischen Beschichten, *Kunststoffe* 84, (1994) 7, pp. 905, 906.
Leitfähige Metallklebebänder, *Elektroautomation* 47, Jahrg., No. 9, (1994), p. 31.
EMV HF–Geschirmte Kabinen und Hallen, MWB Messwandler–Bau AG, Sep. 7, 1988, Wabenkamine/Belüftung.

*Primary Examiner*—Richard L. Chiesa
*Attorney, Agent, or Firm*—Pauley Petersen Kinne & Fejer

[57] ABSTRACT

A filter ventilator built in a HF-tight manner into a slot of a mounting plate. An electroconductive housing and an electroconductive adhesive seals a transition between the housing and the mounting plate in an HF-tight manner to ensure HF-tightness.

12 Claims, 1 Drawing Sheet

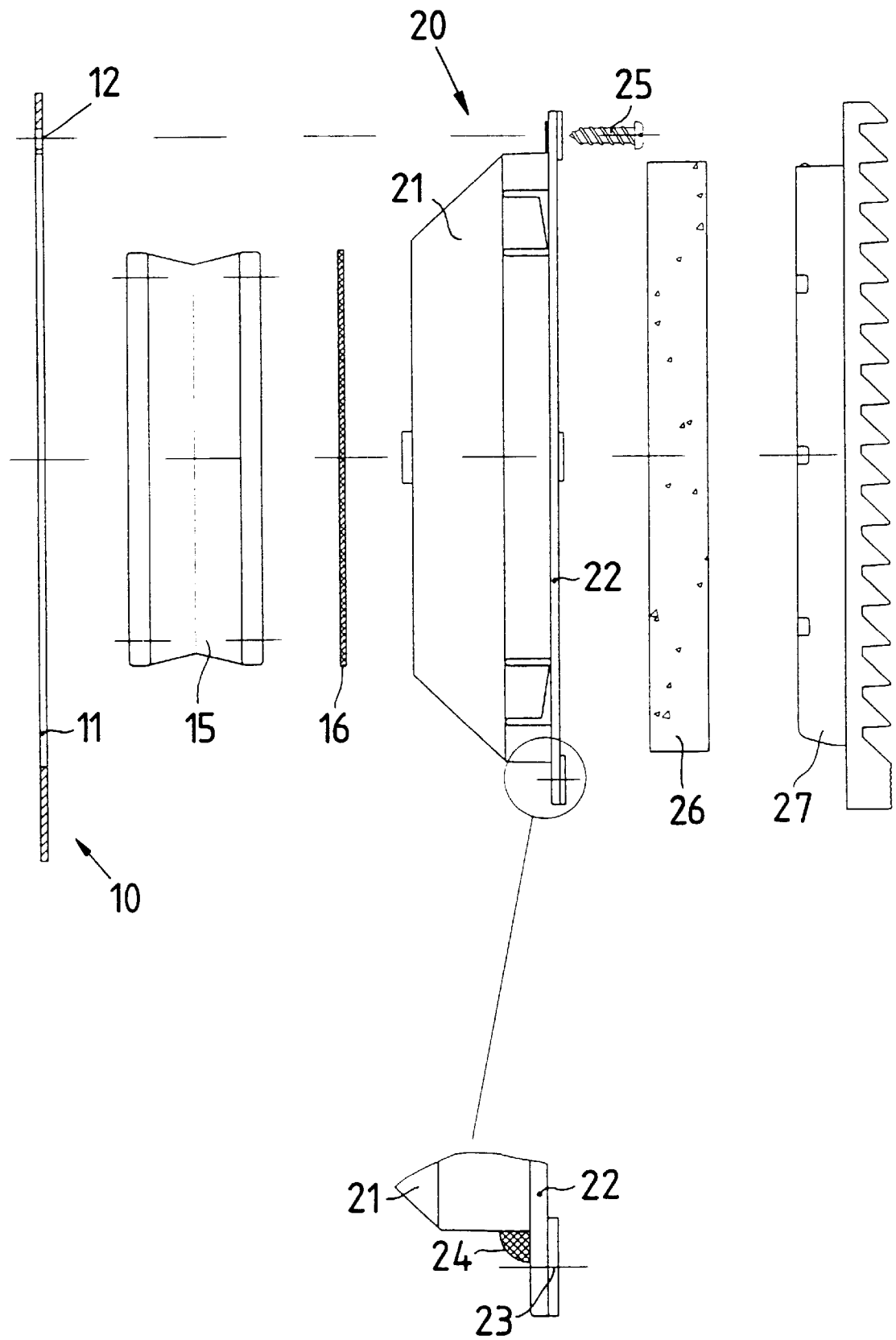

FILTER VENTILATOR BUILT IN A HF-TIGHT MANNER INTO A SLOT OF A MOUNTING PLATE

BACKGROUND OF THE INVENTION

1. Field of the Invention

This invention relates to filter ventilator, which is installed into a slot of a mounting plate, in a high frequency (HF)-sealed manner.

2. Description of Prior Art

When installing a filter ventilator into a slot of a mounting plate used as a switchgear cabinet, in connection with certain applications, there is the need for a definite HF seal also in the area of the filter ventilator. This is particularly required in a switchgear cabinet which is sealed HF-tight.

SUMMARY OF THE INVENTION

It is one object of this invention to achieve a definite HF seal with a simple construction and a simple installation of the filter ventilator.

This object is attained with a housing having an electrically conductive coating which projects with a receiving element through a slot in a mounting plate and is connected with the mounting plate with a flange and with the interposition of an electrically conducting adhesive around the slot of the mounting plate. With the interposition of a wire screen, a ventilator is connected with the receiving element of the housing projecting through the slot. The filter mat is inserted into the receiving element of the housing and is covered by a laminated grid.

The electrically conductive housing and the electrically conductive wire screen cover the slot of the mounting plate in an HF-tight manner, and the adhesive layer placed between the flange of the housing and the mounting plate seals a transition area between the housing and the mounting plate, also in an HF-tight manner, to assure an absolutely HF-tight installation of the filter ventilator.

The installation of the filter ventilator is simpler and easier because a coat of the adhesive, which surrounds a corner area formed between the receiving element and the flange of the housing, is applied prior to inserting the housing into the slot in the mounting plate.

The connection between the housing and the mounting plate can be further improved if the flange of the housing is also bolted to the mounting plate, which has screw receptacles.

In accordance with one preferred embodiment the side of the receiving element of the housing facing the wire screen and the ventilator is embodied as a screen, and the filter mat can thus be supported in the receiving element of the housing without the housing unnecessarily restricting air flow.

The wire screen preferably has a fine mesh and is attached, together with the ventilator, to the receiving element of the housing.

In accordance with one method of this invention, the installation can be simplified if the ventilator, the wire screen and the housing are a prefabricated unit which, provided with the coat of electrically conductive adhesive, is connected with the mounting plate, and if the filter mat is inserted into the housing and covered with the laminated screen.

BRIEF DESCRIPTION OF THE DRAWING

This invention will be explained in greater detail when taken in view of the filter ventilator represented in an exploded view in the drawings.

DESCRIPTION OF PREFERRED EMBODIMENTS

The mounting plate 10 in the drawings can be a wall of a switchgear cabinet and has a slot 11. Screw receptacles 12 are inserted around the slot 11. One essential part of the filter ventilator is the housing 20, which has an electrically conductive coating. The housing 20 can be made of a plastic material and afterwards can be coated with the electrically conductive adhesive.

The housing 20 has a receiving element 21 and a flange 22 with fastening bores 23. The cup-shaped receiving element 21 corresponds to the slot 11 and is connected with a wire screen 16 and the ventilator 15 prior to being installed. The housing 20, the wire screen 16 and the ventilator 15 can be a prefabricated unit, which can be placed into the slot 11 of the mounting plate 10. A layer of an electrically conductive adhesive 24, enclosing the corner area formed between the receiving element 21 and the flange 22 of the housing 20, is applied prior to insertion. The prefabricated unit is bolted to the mounting plate 10 by means of screws 25. In the process, the electrically conductive adhesive 24 is spread and seals the transition, between the mounting plate 10 and the flange 22 of the housing 20, in an HF-tight manner.

The filter mat 26 is inserted into the receiving element 21 of the housing and is covered by a laminated screen 27. The filter ventilator is installed absolutely HF-tight in the slot 11 of the mounting plate 10. The wire screen 16 is perferably of a fine mesh. The side of the receiving element 21 facing the wire screen 16 is preferably of a screen and supports the inserted filter mat 26.

The elements of the filter ventilator are simple and installation can be performed with little assembly effort.

I claim:

1. In a filter ventilator installed into a slot of a mounting plate in an HF-sealed manner, the improvement comprising:
   an electrically conductive housing (20) having a receiving element (21) accommodating a filter mat (26) projecting through the slot (11) in the mounting plate (10) and connected with the mounting plate (10) by a flange (22), an electrically conducting adhesive (24) positioned around the slot (11);
   a wire screen (16) connecting a ventilator (15) with the receiving element (21) of the housing (20) projecting through the slot (11); and
   the filter mat (26) inserted within the receiving element (21) of the housing (20) and covered by a laminated grid (27).

2. In the filter ventilator in accordance with claim 1, wherein
   a coat of the electrically conducting adhesive (24) which surrounds a corner area formed between the receiving element (21) and the flange (22) of the housing (20) is applied prior to inserting the housing (20) into the slot (11) in the mounting plate (10).

3. In the filter ventilator in accordance with claim 2, wherein
   the flange (22) of the housing (20) is bolted to the mounting plate (10) which has a plurality of screw receptacles (12).

4. In the filter ventilator in accordance with claim 3, wherein
   a side of the receiving element (21) of the housing (20) facing the wire screen (16) and the ventilator (15) is formed as a screen.

5. In the filter ventilator in accordance with claim 4, wherein the wire screen (16) is of a fine mesh and is attached with the ventilator (15) to the receiving element (21) of the housing (20).

6. In the filter ventilator in accordance with claim 5, wherein the ventilator (15), the wire screen (16) and the housing (20) are a prefabricated unit which with the electrically conductive adhesive (24) is connected with the mounting plate (10); and the filter mat (26) is then inserted into the housing (20) and covered with the laminated grid (27).

7. In the filter ventilator in accordance with claim 6, wherein the housing (20) is constructed of a plastic material and is coated with an electrically conductive layer.

8. In the filter ventilator in accordance with claim 1, wherein the flange (22) of the housing (20) is bolted to the mounting plate (10) which has a plurality of screw receptacles (12).

9. In the filter ventilator in accordance with claim 1, wherein a side of the receiving element (21) of the housing (20) facing the wire screen (16) and the ventilator (15) is formed as a screen.

10. In the filter ventilator in accordance with claim 1, wherein the wire screen (16) is of a fine mesh and is attached with the ventilator (15) to the receiving element (21) of the housing (20).

11. In the filter ventilator in accordance with claim 1, wherein the ventilator (15), the wire screen (16) and the housing (20) are a prefabricated unit which with the electrically conductive adhesive (24) is connected with the mounting plate (10); and the filter mat (26) is then inserted into the housing (20) and covered with the laminated grid (27).

12. In the filter ventilator in accordance with claim 1, wherein the housing (20) is constructed of a plastic material and is coated with an electrically conductive layer.

* * * * *